United States Patent
Yamada et al.

(10) Patent No.: US 10,242,869 B2
(45) Date of Patent: Mar. 26, 2019

(54) METHOD OF MANUFACTURING SWITCHING ELEMENT HAVING GALLIUM NITRIDE SUBSTRATE

(71) Applicant: TOYOTA JIDOSHA KABUSHIKI KAISHA, Toyota-shi, Aichi-ken (JP)

(72) Inventors: Tetsuya Yamada, Seto (JP); Hiroyuki Ueda, Nagakute (JP); Tomohiko Mori, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/842,249

(22) Filed: Dec. 14, 2017

(65) Prior Publication Data

US 2018/0182621 A1 Jun. 28, 2018

(30) Foreign Application Priority Data

Dec. 27, 2016 (JP) ................... 2016-253957

(51) Int. Cl.
*H01L 21/205* (2006.01)
*H01L 21/02* (2006.01)
(Continued)

(52) U.S. Cl.
CPC .. *H01L 21/02579* (2013.01); *H01L 21/02458* (2013.01); *H01L 21/2056* (2013.01);
(Continued)

(58) Field of Classification Search
CPC ......... H01L 21/02458; H01L 21/02579; H01L 21/2056; H01L 21/8252; H01L 29/2003;
(Continued)

(56) References Cited

U.S. PATENT DOCUMENTS 5,528,058 A 6/1996 Pike, Jr. et al.
6,365,932 B1 4/2002 Kouno et al.
(Continued)

FOREIGN PATENT DOCUMENTS

EP 1965436 A2 9/2008
JP 2000-106428 A 4/2000
JP 2009-147381 A 7/2009

OTHER PUBLICATIONS

U.S. Appl. No. 15/833,938, filed Dec. 6, 2017 in the name of Yamada et al.
(Continued)

*Primary Examiner* — Stephen W Smoot
(74) *Attorney, Agent, or Firm* — Oliff PLC

(57) ABSTRACT

A method of manufacturing a switching element includes forming a recessed portion in a surface of a GaN semiconductor substrate in which a first n-type semiconductor layer is exposed on the surface, growing a p-type body layer within the recessed portion and on the surface of the GaN semiconductor substrate, removing a surface layer portion of the body layer to expose the first n-type semiconductor layer on the surface of the GaN semiconductor substrate, and leave the body layer within the recessed portion, forming a second n-type semiconductor layer which is separated from the first n-type semiconductor layer by the body layer and is exposed on the surface of the GaN semiconductor substrate, and forming a gate electrode which faces the body layer through an insulating film.

6 Claims, 7 Drawing Sheets

(51) Int. Cl.
  *H01L 29/66* (2006.01)
  *H01L 29/20* (2006.01)
  *H01L 21/8252* (2006.01)
  *H01L 29/78* (2006.01)
  *H01L 29/739* (2006.01)

(52) U.S. Cl.
  CPC ...... *H01L 21/8252* (2013.01); *H01L 29/2003* (2013.01); *H01L 29/6634* (2013.01); *H01L 29/66522* (2013.01); *H01L 29/66666* (2013.01); *H01L 29/7395* (2013.01); *H01L 29/7802* (2013.01)

(58) Field of Classification Search
  CPC ........... H01L 29/66333; H01L 29/6634; H01L 29/66522; H01L 29/66666; H01L 29/7395; H01L 29/7396; H01L 29/7827
  See application file for complete search history.

(56) References Cited

U.S. PATENT DOCUMENTS

| | | | | |
|---|---|---|---|---|
| 7,029,969 B2* | 4/2006 | Tarui | ................... | H01L 21/0465 438/212 |
| 8,963,218 B2 | 2/2015 | Sobti et al. | | |
| 9,070,765 B2 | 6/2015 | Finney et al. | | |
| 9,799,734 B2 | 10/2017 | Ishigaki et al. | | |
| 2004/0157355 A1* | 8/2004 | Kachi | ................. | H01L 29/7786 438/46 |
| 2004/0188755 A1 | 9/2004 | Tarui et al. | | |
| 2010/0148174 A1* | 6/2010 | Nakahata | .............. | C30B 29/406 257/51 |
| 2012/0273871 A1 | 11/2012 | Yedinak et al. | | |
| 2015/0034964 A1* | 2/2015 | Takeya | ................ | H01L 21/0242 257/76 |
| 2015/0097226 A1 | 4/2015 | Lichtenwalner et al. | | |
| 2015/0171016 A1 | 6/2015 | Okuno et al. | | |
| 2015/0294865 A1 | 10/2015 | Tsai et al. | | |
| 2016/0043199 A1* | 2/2016 | Sumi | ................. | H01L 29/66712 438/268 |
| 2017/0200819 A1* | 7/2017 | Sugimoto | ............. | H01L 23/535 |
| 2018/0182883 A1* | 6/2018 | Yamada | ........... | H01L 29/66068 |

OTHER PUBLICATIONS

May 25, 2018 Office Action issued in U.S. Appl. No. 15/833,938.
Sep. 12, 2018 Office Action issued in U.S. Appl. No. 15/833,938.

\* cited by examiner

METHOD OF MANUFACTURING SWITCHING ELEMENT HAVING GALLIUM NITRIDE SUBSTRATE

INCORPORATION BY REFERENCE

The disclosure of Japanese Patent Application No. 2016-253957 filed on Dec. 27, 2016 including the specification, drawings and abstract is incorporated herein by reference in its entirety.

BACKGROUND

1. Technical Field

The present disclosure relates to a method of manufacturing a switching element.

2. Description of Related Art

Japanese Unexamined Patent Application Publication No. 2009-147381 (JP 2009-147381 A) discloses a technique for forming a switching element by implanting p-type impurity ions and n-type impurity ions into an SiC semiconductor substrate. When impurity ions are implanted into the SiC semiconductor substrate, crystal defects are formed inside the SiC semiconductor substrate. However, the SiC semiconductor substrate is annealed thereafter such that the crystal defects formed inside the SiC semiconductor substrate are reduced, and thus it is possible to recover crystallinity of the SiC semiconductor substrate.

SUMMARY

A technique for manufacturing a switching element by using a GaN semiconductor substrate has been developed. In the GaN semiconductor substrate, it is difficult to reduce crystal defects that are present inside a p-type semiconductor layer through annealing, and thus it is difficult to recover crystallinity of the GaN semiconductor substrate. Therefore, when a p-type semiconductor layer is formed through ion implantation as disclosed in Japanese Unexamined Patent Application Publication No. 2009-147381 (JP 2009-147381 A), it is difficult to recover the crystal defects formed in the p-type semiconductor layer through ion implantation.

An on-resistance of the switching element including a p-type body layer (a semiconductor layer in which a channel is formed) greatly changes depending on a crystal defect density of the body layer. When the crystal defect density of the body layer is high, the on-resistance of the switching element is increased, and thus a loss easily occurs in the switching element.

When the body layer is formed in the GaN semiconductor substrate through ion implantation, a crystal defect density of the body layer is further increased. In this case, it is difficult to recover the crystallinity of the body layer. For this reason, when the body layer is formed in the GaN semiconductor substrate through ion implantation, there is a possibility that an on-resistance of the switching element is further increased.

An aspect of the disclosure relates to a method of manufacturing a switching element. The method includes: forming a recessed portion in a surface of a GaN semiconductor substrate in which a first n-type semiconductor layer is exposed on the surface; growing a body layer which is a p-type GaN semiconductor layer within the recessed portion and on the surface of the GaN semiconductor substrate; removing a surface layer portion of the body layer to expose the first n-type semiconductor layer on the surface of the GaN semiconductor substrate, and leave the body layer within the recessed portion; forming a second n-type semiconductor layer, which is separated from the first n-type semiconductor layer by the body layer and is exposed on the surface of the GaN semiconductor substrate, in a portion within a distribution region of the body layer after the surface layer portion of the body layer is removed; and forming a gate electrode, which faces the body layer through an insulating film, in a range in which the body layer is exposed between the first n-type semiconductor layer and the second n-type semiconductor layer on the surface of the GaN semiconductor substrate after the surface layer portion of the body layer is removed.

According to the aspect of the present disclosure, either the forming the second n-type semiconductor layer or the forming the gate electrode may be first performed. Meanwhile, in a case where the forming the gate electrode is first performed, a structure in which the gate electrode is provided within a range in which the body layer is exposed between the first n-type semiconductor layer and the second n-type semiconductor layer on the surface of the GaN semiconductor substrate may be obtained at a stage in which both the forming the gate electrode and the forming the second n-type semiconductor layer are completed.

According to the aspect of the present disclosure, the body layer is constituted by a p-type semiconductor layer grown within the recessed portion. The body layer can be formed without using ion implantation. For this reason, according to the manufacturing method, it is possible to manufacture the switching element with a lower on-resistance.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
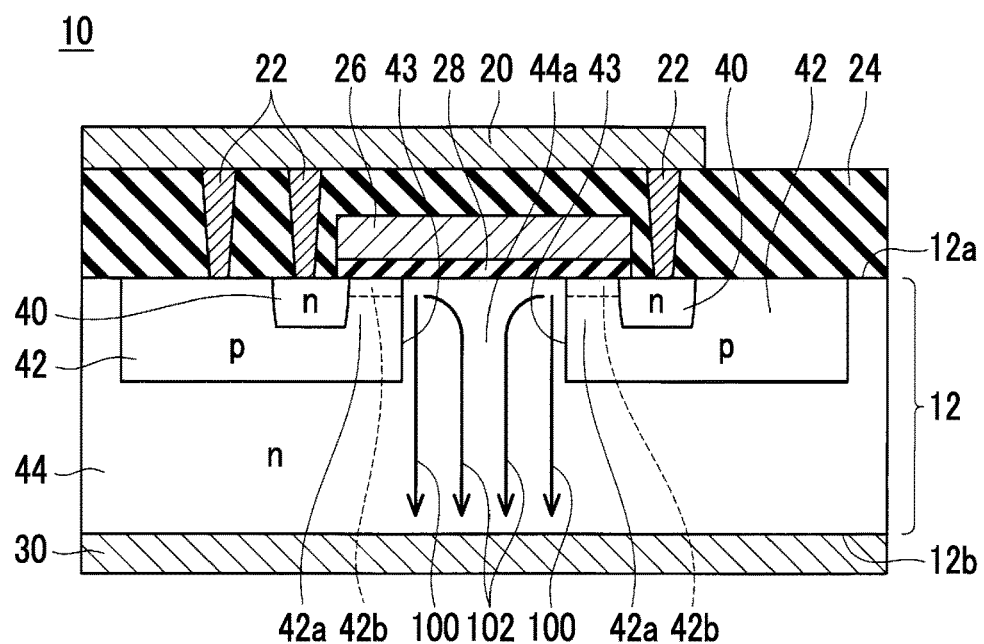
FIG. 1 is a cross-sectional view of a MOSFET according to Example 1.

A MOSFET 10 illustrated in FIG. 1 includes a GaN semiconductor substrate 12. The GaN semiconductor substrate 12 is a semiconductor substrate containing a gallium nitride (GaN) as a main component.

The GaN semiconductor substrate 12 includes a plurality of source layers 40, a plurality of body layers 42, and a drift layer 44.

Each of the source layers 40 is an n-type region, and is exposed to an upper surface 12a of the GaN semiconductor substrate 12.

Each of the body layers 42 is a p-type region, and is disposed in the vicinity of the corresponding source layer 40. Each of the body layers 42 covers the side surface and the lower surface of the corresponding source layer 40. Each of the body layers 42 is exposed to the upper surface 12a of the GaN semiconductor substrate 12 in a range adjacent to the source layer 40.

The drift layer 44 is an n-type region, and is disposed under the body layers 42. In addition, the drift layer 44 is also disposed between a pair of body layers 42. Hereinafter, a portion of the drift layer 44 which is positioned between the body layers 42 is referred to as a spacing portion 44a. The spacing portion 44a may be referred to as a JFET region. The spacing portion 44a is exposed to the upper surface 12a of the GaN semiconductor substrate 12 in a range in which the spacing portion is interposed between the body layers 42. In addition, the drift layer 44 is exposed to substantially the entire region of a lower surface 12b of the GaN semiconductor substrate 12. The drift layer 44 is separated from each source layer 40 by each body layer 42.

A gate insulating film 28, a gate electrode 26, an interlayer insulating film 24, a contact plug 22, and an upper electrode 20 are disposed on the upper surface 12a of the GaN semiconductor substrate 12.

The gate insulating film 28 covers a portion of the upper surface 12a of the GaN semiconductor substrate 12. The gate insulating film 28 covers the upper surface 12a of the GaN semiconductor substrate 12 between the source layers 40. That is, the gate insulating film 28 covers the surface of a portion 42a which is positioned on the surface of the spacing portion 44a of the drift layer 44 and between the source layer 40 of each body layer 42 and the spacing portion 44a. In addition, the gate insulating film 28 covers the surface of the source layer 40 in the vicinity of the body layer 42. A portion (that is, a surface layer portion of the portion 42a), which is in contact with the gate insulating film 28 in each body layers 42, is a channel region 42b in which a channel is formed. The gate insulating film 28 is constituted by an insulator such as a silicon oxide.

The gate electrode 26 is disposed on the gate insulating film 28. The gate electrode 26 faces the body layer 42 (that is, the portion 42a) and the drift layer 44 (that is, the spacing portion 44a) through the gate insulating film 28. The gate electrode 26 is insulated from the GaN semiconductor substrate 12 by the gate insulating film 28.

The interlayer insulating film 24 covers the upper surface 12a in a range which is not covered with the gate insulating film 28. In addition, the interlayer insulating film 24 covers the surface of the gate electrode 26. The interlayer insulating film 24 is constituted by an insulator such as an oxide silicon.

The interlayer insulating film 24 is provided with a plurality of contact holes, and the contact plug 22 is provided within each of the contact holes. Some of the contact plugs 22 are connected to the source layer 40 at the lower end thereof, and the other contact plugs 22 are connected to the body layer 42 at the lower end thereof.

The upper electrode 20 is disposed on the interlayer insulating film 24. The upper electrode 20 is in contact with the upper surface of each contact plug 22. The upper electrode 20 is connected to the source layer 40 and the body layer 42 through the contact plug 22.

A lower electrode 30 is disposed on the lower surface 12b of the GaN semiconductor substrate 12. The lower electrode 30 is connected to the drift layer 44.

When the potential of the gate electrode 26 is set to be larger than a gate threshold value (the minimum gate potential needed for the turn-on of the MOSFET 10), electrons are drawn to the channel region 42b of the body layer 42, and thus a channel is formed in the channel region 42b. The source layer 40 and the drift layer 44 are connected to each other through the channel, such that the MOSFET 10 is turned on, and thus a current can flow from the drift layer 44 to the source layer 40. Since a current concentrates on the channel region 42b, the presence of crystal defects with high density in the channel region 42b results in a further increase in an on-resistance of the MOSFET 10. In addition, when the density of the crystal defects in the channel region 42b cannot be accurately controlled, variations in the on-resistance and a gate threshold value of the MOSFET 10 are increased. Hereinafter, a description will be given of a method of manufacturing the MOSFET 10 which is capable of suppressing the density of the crystal defects in the channel region 42b and accurately controlling the density of the crystal defects.

First, the GaN semiconductor substrate 12 before processing is prepared. The entire GaN semiconductor substrate 12 before processing is constituted by the drift layer 44.

Stopper Layer Forming Step

Figure 2:
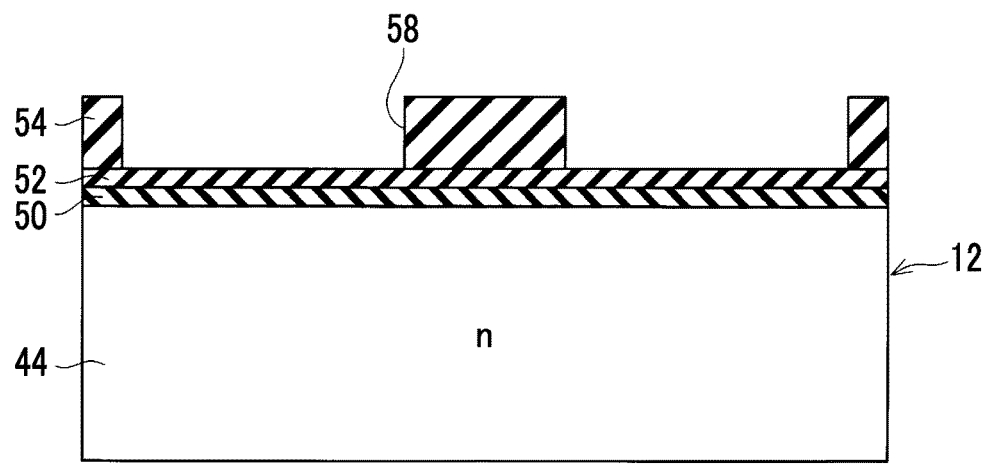
FIG. 2 is a diagram illustrating a method of manufacturing the MOSFET according to Example 1.

As illustrated in FIG. 2, a stopper layer 50 formed of a silicon nitride (SiN) is formed on the entire upper surface of the GaN semiconductor substrate 12. Meanwhile, the stopper layer 50 may be formed of an aluminum nitride (AlN), a silicon oxide ($SiO_2$), or the like.

Hard Mask Forming Step

Next, a hard mask 52 formed of a silicon oxide is formed on the entire upper surface of the stopper layer 50.

Resist Forming Step

Next, a resist 54 formed of a resin is formed on the entire upper surface of the hard mask 52. Next, as illustrated in FIG. 2, the resist 54 is patterned by photolithography. Here, an opening 58 is formed in an upper portion in a range in which the body layer 42 is to be formed.

Hard Mask Patterning Step

Figure 3:
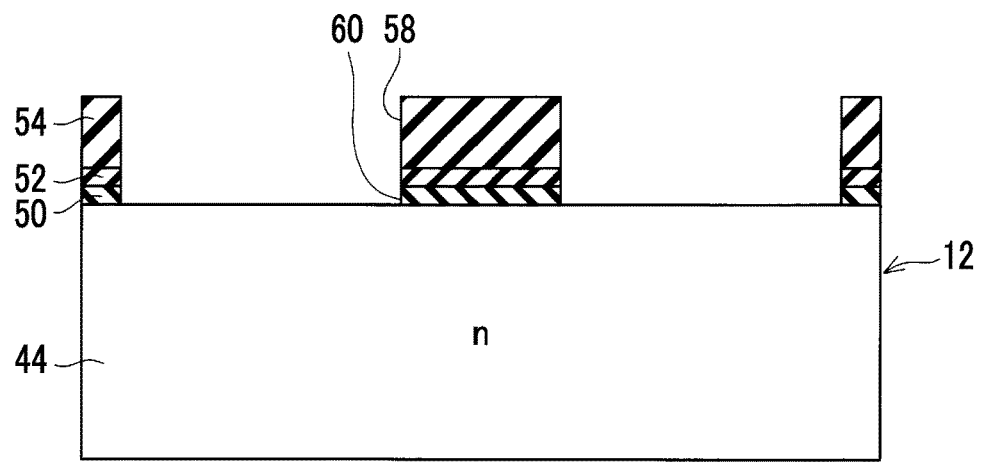
FIG. 3 is a diagram illustrating a method of manufacturing the MOSFET according to Example 1.

Next, as illustrated in FIG. 3, the hard mask 52 and the stopper layer 50 are etched through Reactive Ion Etching (ME) or the like by using the resist 54 as a mask. Thereby, an opening 60 is provided in the hard mask 52 and the stopper layer 50. After the opening 60 is formed, the resist 54 is removed.

Recessed Portion Forming Step

Figure 4:
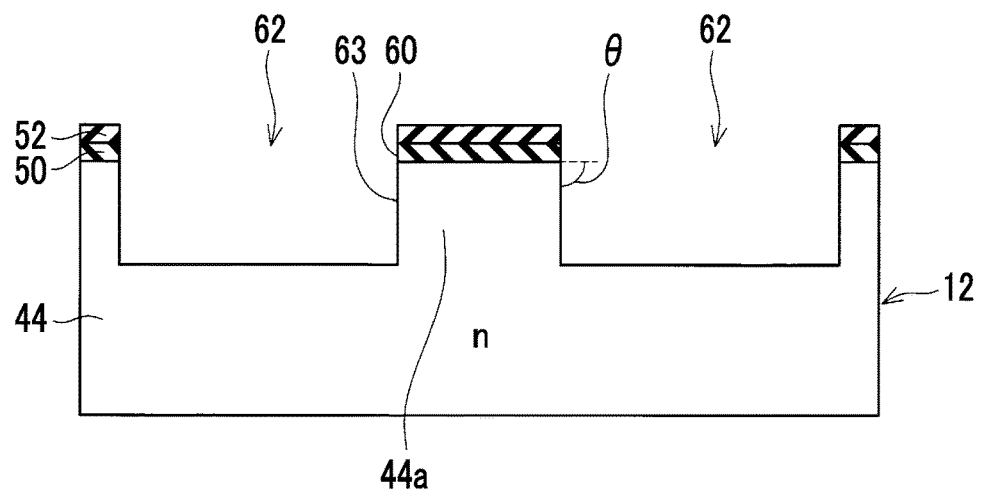
FIG. 4 is a diagram illustrating a method of manufacturing the MOSFET according to Example 1.
Figure 5:
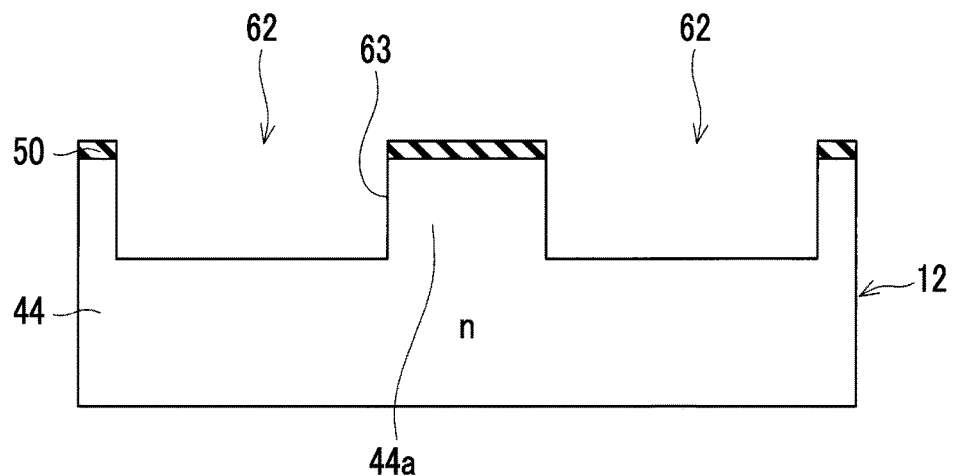
FIG. 5 is a diagram illustrating a method of manufacturing the MOSFET according to Example 1.

Next, as illustrated in FIG. 4, the GaN semiconductor substrate 12 is etched through RIE or the like by using the hard mask 52 as a mask. Thereby, recessed portions 62 are formed within the opening 60. Meanwhile, here, the recessed portion 62 is formed such that a side surface 63 of the recessed portion 62 is substantially perpendicular (in more detail, an angle θ between the side surface 63 and the upper surface of the GaN semiconductor substrate 12 is equal to or greater than 80° and equal to or less than 90°) to the upper surface of the GaN semiconductor substrate 12 by adjusting etching conditions. For example, it is possible to make the side surface 63 substantially perpendicular to the upper surface of the GaN semiconductor substrate 12 by making the thickness of the hard mask 52 uniform and adjusting conditions such as a gas type, a pressure, and an RF power. Meanwhile, the drift layer 44 which is a portion positioned between two recessed portions 62 is equivalent to the above-described spacing portion 44*a*. When the recessed portions 62 are formed, the hard mask 52 is removed to expose the stopper layer 50 as illustrated in FIG. 5.

Body Layer Growing Step

Figure 6:
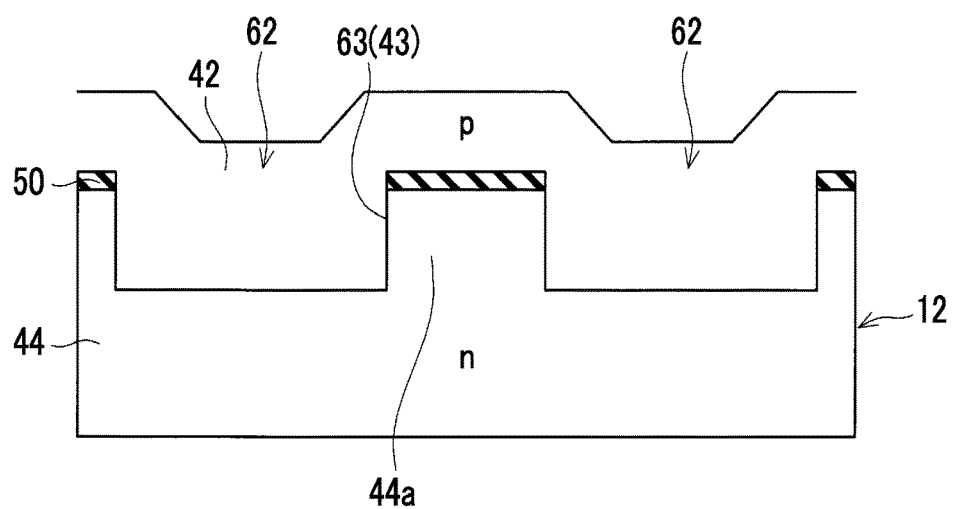
FIG. 6 is a diagram illustrating a method of manufacturing the MOSFET according to Example 1.

Next, as illustrated in FIG. 6, the body layer 42 which is a p-type GaN semiconductor layer is grown (deposited) on the upper surface of the GaN semiconductor substrate 12 and within the recessed portion 62 through epitaxial growth. Here, the body layer 42 is grown so as to have a depth larger than the depth of the recessed portion 62. When the body layer 42 is formed, the side surface 63 of the recessed portion 62 serves as an interface 43 (pn-junction surface) between the body layer 42 and the drift layer 44. In addition, the stopper layer 50 is covered with the body layer 42. Hereinafter, the entire GaN semiconductor layer including the drift layer 44 and the body layer 42 will be referred to as the GaN semiconductor substrate 12.

Drift Layer Exposure Step

Figure 7:
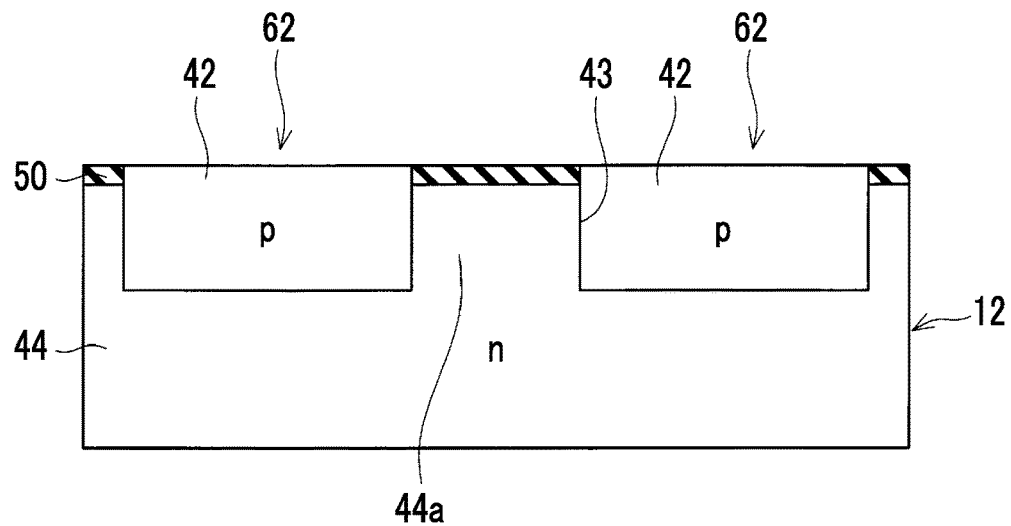
FIG. 7 is a diagram illustrating a method of manufacturing the MOSFET according to Example 1.
Figure 8:
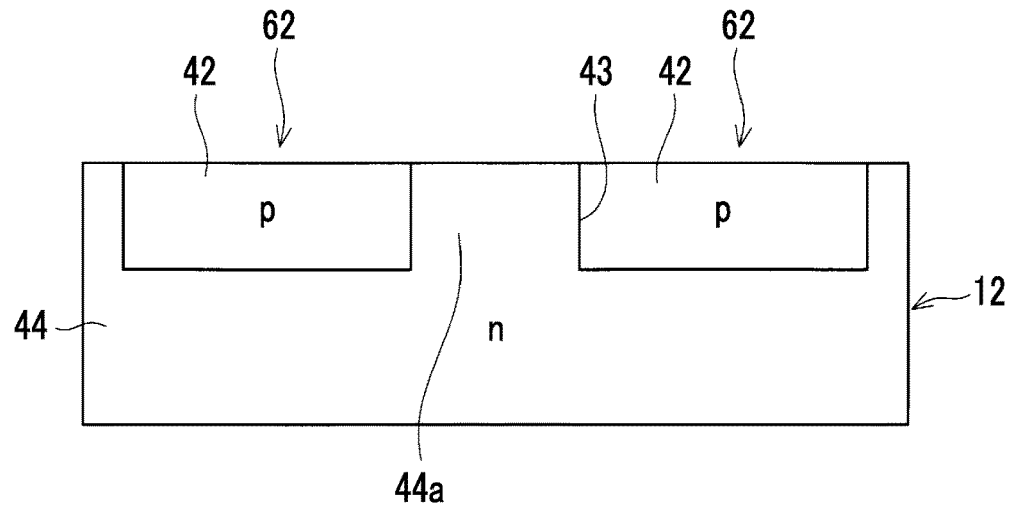
FIG. 8 is a diagram illustrating a method of manufacturing the MOSFET according to Example 1.

Next, the upper surface (that is, the surface of the body layer 42) of the GaN semiconductor substrate 12 is polished by Chemical Mechanical Polishing (CMP). Here, the body layer 42 is polished on a condition that the body layer 42 can be polished with higher polishing efficiency than that of the stopper layer 50. When the body layer 42 is polished, the stopper layer 50 is exposed to the upper surface of the GaN semiconductor substrate 12 as illustrated in FIG. 7. However, the upper surface of the GaN semiconductor substrate 12 is covered with a whetstone or an abrasive, and thus it is not possible to visually perceive the exposure of the stopper layer 50 from the outside. However, when the stopper layer 50 is exposed, polishing efficiency is lowered. For example, a polishing rate (thickness of cutting per unit time) is reduced, or a torque of a motor during polishing is changed. Therefore, it is possible to detect the exposure of the stopper layer 50 by detecting the polishing rate or the torque. When the exposure of the stopper layer 50 is detected, polishing is performed using a slurry for making the polishing efficiency of the stopper layer 50 and the polishing efficiency of the GaN semiconductor substrate 12 substantially the same as each other. Thereby, the stopper layer 50 and the body layer 42 are polished to remove the stopper layer 50 as illustrated in FIG. 8. As a result, the drift layer 44 (that is, the spacing portion 44*a*) which is present under the stopper layer 50 is exposed to the upper surface of the GaN semiconductor substrate 12. In addition, the body layer 42 is left within the recessed portion 62. In this manner, the exposure of the stopper layer 50 is detected based on the polishing rate, and thus it is possible to perform polishing by the amount of polishing which is needed for the subsequent removal (that is, the exposure of the drift layer 44) of the stopper layer 50 and to prevent the GaN semiconductor substrate 12 from being excessively polished. That is, it is possible to suppress a variation of the amount of polishing.

Source Layer Forming Step

Figure 9:
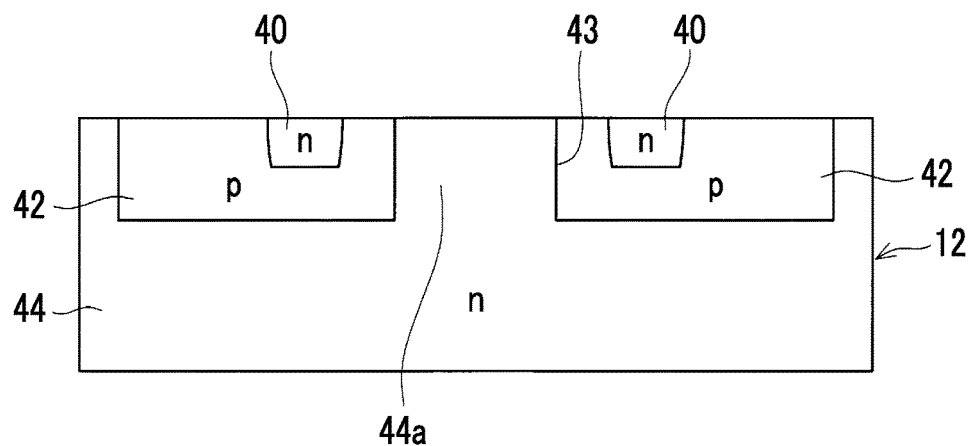
FIG. 9 is a diagram illustrating a method of manufacturing the MOSFET according to Example 1.

Next, as illustrated in FIG. 9, the source layer 40 is formed by selectively implanting n-type impurity ions into a portion of the body layer 42.

Figure 10:
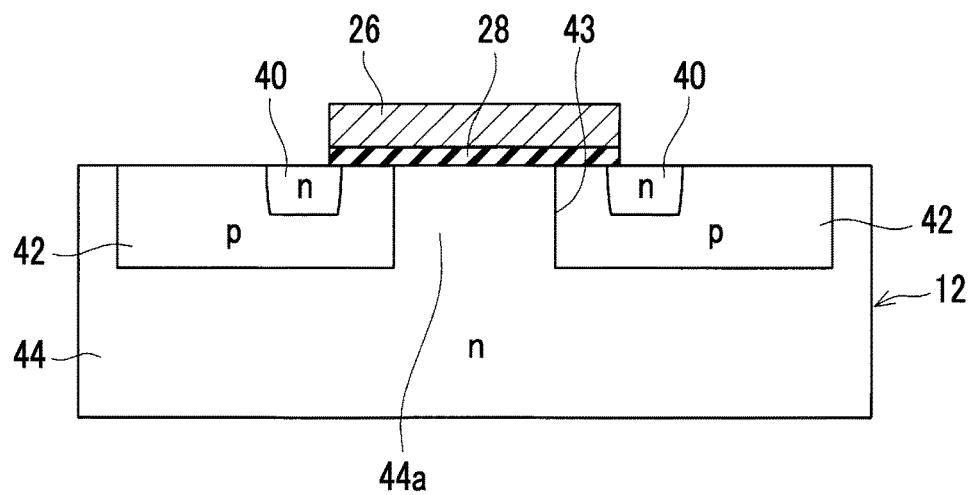
FIG. 10 is a diagram illustrating a method of manufacturing the MOSFET according to Example 1.

Next, as illustrated in FIG. 10, the gate insulating film 28 is formed so as to cover the upper surface of the GaN semiconductor substrate 12 between the source layers 40, and the gate electrode 26 is formed on the gate insulating film 28. Thereafter, the interlayer insulating film 24, the contact plug 22, and the upper electrode 20, and the lower electrode 30 are formed to thereby complete the MOSFET 10 illustrated in FIG. 1.

In the above-described manufacturing method, the body layer 42 is formed by epitaxial growth in the body layer growing step. In addition, the source layer 40 is formed by implanting ions into a portion of the body layer 42 in the source layer forming step, but ions are hardly implanted into the channel region 42*b* (that is, the body layer 42 between the source layer 40 and the spacing portion 44*a*) of the body layer 42. Therefore, according to the manufacturing method, it is possible to further reduce the density of crystal defects in the channel region 42*b*. For this reason, according to the manufacturing method, it is possible to manufacture the MOSFET 10 with a lower on-resistance. In addition, ions are hardly implanted into the channel region 42*b*, which hardly causes a variation in the density of crystal defects in the channel region 42*b*. Therefore, according to the manufacturing method, it is possible to suppress variations in an on-resistance and a gate threshold value which occur between the MOSFETs 10 during mass production.

In addition, in the manufacturing method, the recessed portion 62 is formed such that the side surface 63 is substantially perpendicular to the upper surface of the GaN semiconductor substrate 12 in the recessed portion forming step, and thus the interface 43 between the body layer 42 and the spacing portion 44*a* of the drift layer 44 extends so as to be substantially perpendicular to the upper surface of the GaN semiconductor substrate 12. In addition, in the drift layer exposure step, the polishing is stopped in a state where a substantially perpendicular portion of the side surface 63 is positioned on the upper surface of the GaN semiconductor substrate 12. For this reason, even when the amount of polishing has an error, the position of the interface 43 in the horizontal direction on the upper surface of the GaN semiconductor substrate 12 hardly changes. For this reason, even when the amount of polishing has an error, a difference hardly occurs in the length of the channel region 42*b*. For this reason, in the manufacturing method, a variation hardly occurs in a channel length between the MOSFETs 10 during mass production, and thus variations in an on-resistance and a gate threshold value are suppressed. Further, an error itself of the amount of polishing is suppressed by the stopper layer 50. Therefore, according to the manufacturing method, it is possible to extremely reduce variations in an on-resistance and a gate threshold value of the MOSFET 10 during mass production.

Figure 11:
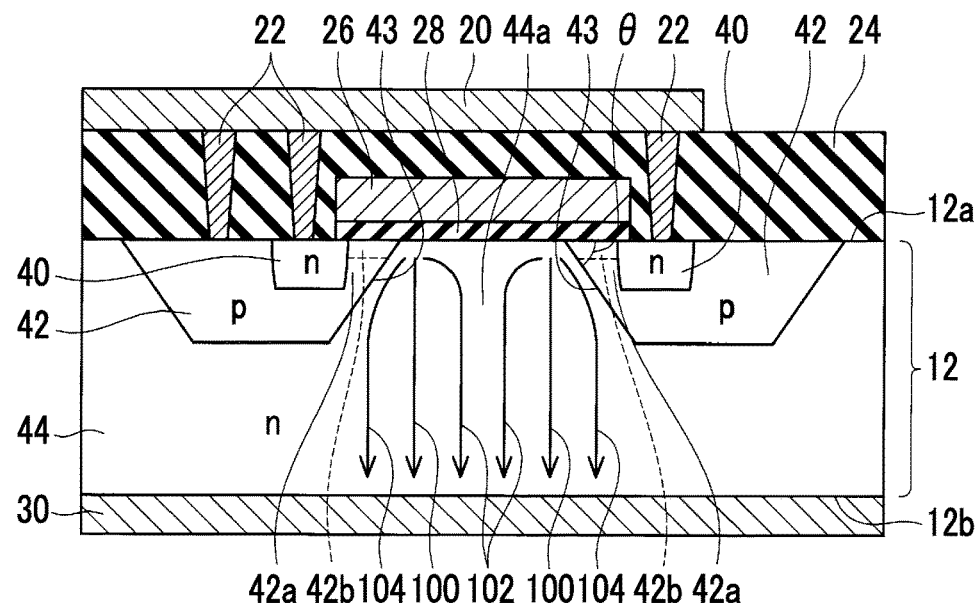
FIG. 11 is a cross-sectional view of a MOSFET according to Example 2.

A MOSFET according to Example 2 illustrated in FIG. 11 is different from the MOSFET 10 according to Example 1 in that an interface 43 between a body layer 42 and a spacing portion 44*a* (that is, a drift layer 44) obliquely extends. The other configurations of the MOSFET according to Example 2 are the same as those of the MOSFET according to Example 1. In Example 2, the interface 43 is inclined such that the thickness of the body layer 42 increase as a distance from the spacing portion 44*a* increases in the horizontal direction (direction parallel to an upper surface 12*a* of a GaN semiconductor substrate 12). An angle θ between the interface 43 and the upper surface 12*a* of the GaN semiconductor substrate 12 is less than 60°.

In the MOSFET 10 according to Example 1, electrons having passed through the channel flow directly downward as indicated by an arrow 100 of FIG. 1, but flow obliquely downward in a direction away from the body layer 42 as indicated by an arrow 102 of FIG. 1. On the other hand, in the MOSFET according to Example 2, as illustrated in FIG. 11, electrons having passed through the channel may flow through a path directed obliquely downward on a side opposite to the arrow 102 as indicated by an arrow 104, in addition to paths indicated by the arrows 100 and 102. In this manner, since the path through which the electrons flow is wide, the MOSFET according to Example 2 has an on-resistance lower than that of the MOSFET 10 according to Example 1.

Next, a method of manufacturing the MOSFET according to Example 2 will be described. First, similarly to the manufacturing method in Example 1, a stopper layer forming step, a hard mask forming step, a resist forming step, and a hard mask patterning step are performed so as to form an opening 60 in a stopper layer 50 and a hard mask 52 as illustrated in FIG. 3. Thereafter, a resist 54 is removed.

Figure 12:
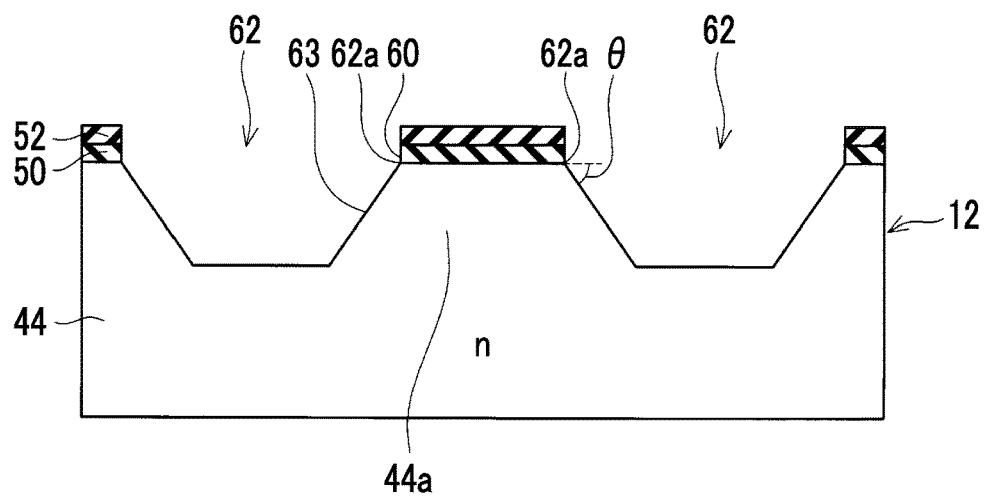
FIG. 12 is a diagram illustrating a method of manufacturing the MOSFET according to Example 2.

Next, in a recessed portion forming step, as illustrated in FIG. 12, the GaN semiconductor substrate 12 is etched through RIE or the like by using the hard mask 52 as a mask to form recessed portions 62. Here, the recessed portion 62 is formed such that a side surface 63 of the recessed portion 62 is inclined to the upper surface of the GaN semiconductor substrate 12 (in more detail, the side surface is inclined such that the depth of the recessed portion 62 increases as a distance from an end 62a of the recessed portion 62 increases) by adjusting etching conditions. For example, the side surface 63 can be inclined to the upper surface of the GaN semiconductor substrate 12 by reducing the thickness of the hard mask 52 serving as a mask up to a position close to the opening 60, adjusting conditions such as a gas type, a pressure, an RF power, and the like and making an etching rate of the GaN semiconductor substrate 12 substantially the same as that of the hard mask 52. Here, the recessed portion 62 is formed such that an angle θ between the side surface 63 and the upper surface of the GaN semiconductor substrate 12 is less than 60°.

Thereafter, similarly to Example 1 described above, steps (a body layer growing step, a drift layer exposure step, a source layer forming step, and the like) are performed to complete the MOSFET according to Example 2 illustrated in FIG. 11. According to the manufacturing method, the side surface 63 of the recessed portion 62 is inclined at a position serving as a lower portion of a gate electrode 26, and thus it is possible to manufacture the MOSFET according to Example 2 in which the interface 43 is inclined below the gate electrode 26.

Figure 13:
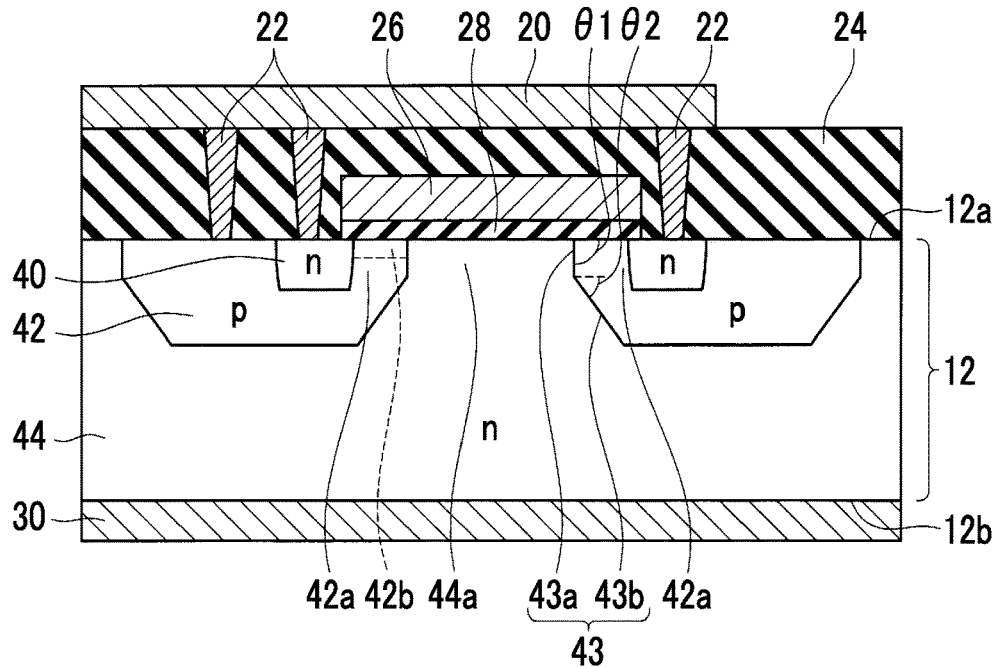
FIG. 13 is a cross-sectional view of a MOSFET according to Example 3.

A MOSFET according to Example 3 illustrated in FIG. 13 is different from the MOSFET 10 according to Example 1 in that an interface 43 between a body layer 42 and a spacing portion 44a (that is, a drift layer 44) includes a small inclined portion 43a and a large inclined portion 43b. The other configurations of the MOSFET according to Example 3 are the same as those of the MOSFET 10 according to Example 1. The small inclined portion 43a is a portion extending so as to be substantially perpendicular to an upper surface 12a in the interface 43. An angle θ1 between the small inclined portion 43a and the upper surface 12a is equal to or greater than 80° and equal to or less than 90°. The small inclined portion 43a is provided in the vicinity of the upper surface 12a, and intersects the upper surface 12a in a substantially perpendicular direction. The large inclined portion 43b is inclined such that the thickness of the body layer 42 increases as a distance from the spacing portion 44a increases in the horizontal direction (direction parallel to the upper surface 12a of the GaN semiconductor substrate 12). An angle θ2 between the large inclined portion 43b and the upper surface 12a is less than 60°. The large inclined portion 43b is provided on the lower side (that is, a position separated from the upper surface 12a) of the small inclined portion 43a.

In the MOSFET according to Example 3, a portion (large inclined portion 43b) of the interface 43 is inclined. For this reason, similarly to the MOSFET according to Example 2, a path through which electrons having passed through a channel flow into the drift layer 44 is wider than that of the MOSFET 10 according to Example 1. Therefore, the MOSFET according to Example 3 has an on-resistance lower than that of the MOSFET 10 according to Example 1.

Next, a method of manufacturing the MOSFET according to Example 3 will be described. First, similarly to the manufacturing method according to Example 1, a stopper layer forming step, a hard mask forming step, a resist forming step, and a hard mask patterning step are performed to form an opening 60 in a stopper layer 50 and a hard mask 52 as illustrated in FIG. 3. Thereafter, a resist 54 is removed.

Figure 14:
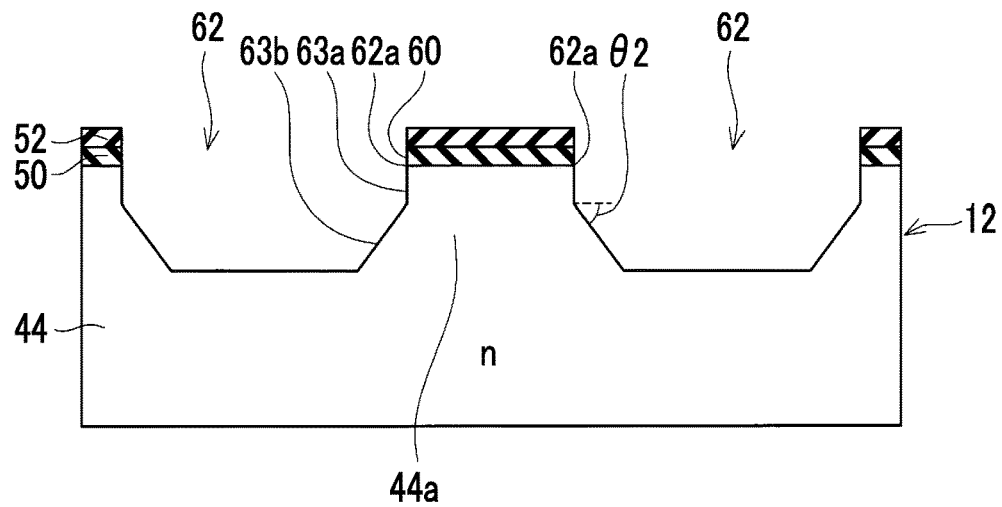
FIG. 14 is a diagram illustrating a method of manufacturing the MOSFET according to Example 3.

Next, a recessed portion forming step is performed. In Example 3, the recessed portion forming step includes a first etching step and a second etching step. In the first etching step, recessed portions 62 are formed as illustrated in FIG. 12, similar to Example 2. In the second etching step, the recessed portion 62 is further etched on a condition that etching uniformly proceeds in the thickness direction of the GaN semiconductor substrate 12. For example, the recessed portion 62 is etched on a condition that an etching selection ratio to the hard mask 52 of the GaN semiconductor substrate 12 is set to 10 or higher. Thereby, as illustrated in FIG. 14, it is possible to form the recessed portion 62 having a shape including the small inclined portion 63a and the large inclined portion 63b.

Thereafter, similarly to Example 1 described above, steps (a body layer growing step, a drift layer exposure step, a source layer forming step, and the like) are performed to complete the MOSFET according to Example 3 illustrated in FIG. 13.

According to the manufacturing method of Example 3, the large inclined portion 63b is provided on the side surface of the recessed portion 62 at a position serving as a lower portion of a gate electrode 26. For this reason, it is possible to manufacture the MOSFET according to Example 3 in which a portion (that is, the large inclined portion 43b) of the interface 43 is inclined below the gate electrode 26.

In addition, in the manufacturing method according to Example 3, a side surface 63 having the small inclined portion 63a which is substantially perpendicular to the upper surface of the GaN semiconductor substrate 12 is formed on the upper surface of the GaN semiconductor substrate 12. In addition, in the drift layer exposure step, polishing is stopped in a state where the small inclined portion 63a is positioned on the upper surface of the GaN semiconductor substrate 12. Therefore, even when the amount of polishing of the upper surface of the GaN semiconductor substrate 12 has an error in the drift layer exposure step, the length of the channel region 42b hardly changes. Therefore, in the manufacturing method according to Example 3, a variation in a channel length between MOSFETs is suppressed during mass production, and thus variations in an on-resistance and a gate threshold value are suppressed.

In addition, in the above-described manufacturing methods according to Examples 1 to 3, a body layer 42 is formed through epitaxial growth, and thus the concentration of p-type impurities within the body layer 42 becomes uniform. For this reason, it is possible to reduce the channel length.

Meanwhile, in the above-described manufacturing methods according to Examples 1 to 3, the stopper layer 50 is formed, but the stopper layer 50 may not be formed. For example, the stopper layer may not be used in a case where it is possible to appropriately adjust the amount of polishing in the drift layer exposure step without using the stopper layer 50.

In addition, in the above-described manufacturing methods according to Examples 1 to 3, the upper surface of the GaN semiconductor substrate 12 is polished in the drift layer exposure step, but etching (for example, RIE) may be used instead of the polishing. That is, the upper surface of the GaN semiconductor substrate 12 may be etched to expose the drift layer 44 to the upper surface of the GaN semiconductor substrate 12. In this case, in order to remove etching damage, the upper surface of the GaN semiconductor substrate 12 may be etched on a low bias condition or may be polished through CMP after the drift layer 44 is exposed. In a case where the etching is used, the stopper layer 50 is unnecessary.

In addition, in Examples 1 to 3 described above, the hard mask 52 formed of a silicon oxide is used as a mask for etching in the recessed portion forming step. However, a resist formed of a resin or the like may be used instead of the hard mask 52.

In addition, in Examples 1 to 3 described above, the body layer 42 is grown so as to have a depth larger than the depth of the recessed portion 62 in the body layer growing step, but the thickness of the body layer 42 to be grown in the body layer growing step may be smaller than the depth of the recessed portion 62.

In addition, in Examples 1 to 3 described above, n-type impurity ions are implanted into a portion of the body layer 42 in the source layer forming step. However, in the source layer forming step, a portion of the body layer 42 may be removed through etching, and the source layer 40 may be grown in the removed portion through epitaxial growth.

In addition, in Examples 1 to 3 described above, a method of manufacturing a MOSFET has been described, but the technique disclosed in the specification may be applied to a method of manufacturing an IGBT. It is possible to obtain a structure of the IGBT by adding a p-type layer between the lower electrode 30 and the drift layer 44.

A relationship between components in the examples and components in claims will be described. The drift layer 44 in the examples is an example of a first n-type semiconductor layer. The source layer 40 in the examples is an example of a second n-type semiconductor layer. The side surface 63 in Example 1 and the small inclined portion 63a in Example 3 are examples of a small inclined portion. The side surface 63 in Example 2 and the large inclined portion 63b in Example 3 are examples of a large inclined portion.

Technical elements of the present disclosure will be listed below. Meanwhile, the following technical elements are independently useful.

In a manufacturing method which is an example of the present disclosure, the forming of the recessed portion may include forming the recessed portion such that a side surface of the recessed portion has a small inclined portion in which an angle to the surface of the GaN semiconductor substrate is equal to or greater than 80° and equal to or less than 90° at a position serving as a lower portion of the gate electrode. In addition, the removing of the surface layer portion of the body layer may include polishing the surface of the GaN semiconductor substrate and stopping the polishing in a state where the small inclined portion is positioned on the surface of the GaN semiconductor substrate.

Meanwhile, in this specification, the angle of the side surface of the recessed portion to the surface of the GaN semiconductor substrate means an angle (angle measured in a space within the recessed portion) which is measured within the recessed portion.

The side surface of the recessed portion serves as an interface between the body layer and a first n-type semiconductor layer. When the position of the interface in a horizontal direction is shifted, a channel length changes, and characteristics of a switching element change. In the above-described manufacturing method which is an example, the small inclined portion of the side surface of the recessed portion and the surface of the GaN semiconductor substrate intersect each other at an angle close to perpendicularity. In addition, the polishing of the GaN semiconductor substrate is stopped in a state where the small inclined portion is positioned on the surface of the GaN semiconductor substrate. For this reason, even when the amount of polishing has an error, the position of the interface between the body layer and the first n-type semiconductor layer in the horizontal direction is hardly shifted. For this reason, the channel length hardly varies. According to the manufacturing method, it is possible to suppress variations in characteristics of the switching element during mass production.

In the manufacturing method which is an example of the present disclosure, the forming the recessed portion may include forming the recessed portion such that the side surface of the recessed portion has a large inclined portion, which is inclined such that the depth of the recessed portion increases as a distance from the end of the recessed portion increases and in which an angle to the surface of the GaN semiconductor substrate is less than 60°, at a position serving as a lower portion of the gate electrode.

In the manufacturing method, it is possible to form the switching element in which a portion (portion equivalent to the large inclined portion of the side surface of the recessed portion) of the interface between the body layer and the first n-type semiconductor layer is inclined. According to the above-described configuration, it is possible to further reduce an on-resistance of the switching element.

In the manufacturing method which is an example of the present disclosure may further include, forming a stopper layer on the surface of the GaN semiconductor substrate before the body layer is grown. The growing of the body layer may include growing the body layer such that the stopper layer is covered. In addition, of the removing the surface layer portion of the body layer may include polishing the body layer until the stopper layer is exposed by using a polishing method in which the polishing efficiency of the stopper layer is lower than the polishing efficiency of the body layer, and polishing the body layer and the stopper layer until the stopper layer is removed.

Meanwhile, the polishing efficiency means the thickness of an object to be polished which is removed per unit energy.

According to the above-described configuration, it is possible to detect the exposure of the stopper layer based on a deterioration in the polishing efficiency. It is possible to expose the first n-type semiconductor layer with the needed minimum amount of polishing by adjusting a polishing time after the stopper layer is exposed.

In the manufacturing method which is an example of the present disclosure, the forming of the recessed portion may include forming the recessed portion in the surface of the GaN semiconductor substrate may be formed through etching.

In the manufacturing method which is an example of the present disclosure, the growing of the body layer may include growing the body layer through epitaxial growth.

As described above, although the embodiments have been described in detail, the embodiments are just examples and do not limit the scope of the claims. The technique described in the claims includes various modification and changes of the specific examples described above. Technical elements described in the specification or drawings show technical utility independently or in various combinations, and are not limited to combinations described in the claims at the time of filing of the application. In addition, the technique described in the specification or drawings achieves a plurality of objects at the same time, and has technical utility even when it achieves one of the objects.

What is claimed is:

1. A method of manufacturing a switching element, the method comprising:
    forming a recessed portion in a surface of a GaN semiconductor substrate in which a first n-type semiconductor layer is exposed on the surface;
    growing a body layer which is a p-type GaN semiconductor layer within the recessed portion and on the surface of the GaN semiconductor substrate;
    removing a surface layer portion of the body layer to expose the first n-type semiconductor layer on the surface of the GaN semiconductor substrate, and leave the body layer within the recessed portion;
    forming a second n-type semiconductor layer, which is separated from the first n-type semiconductor layer by the body layer and is exposed on the surface of the GaN semiconductor substrate, in a portion within a distribution region of the body layer after the surface layer portion of the body layer is removed; and
    forming a gate electrode, which faces the body layer through an insulating film, in a range in which the body layer is exposed between the first n-type semiconductor layer and the second n-type semiconductor layer on the surface of the GaN semiconductor substrate after the surface layer portion of the body layer is removed.

2. The method according to claim 1, wherein:
    the forming of the recessed portion includes forming the recessed portion such that a side surface of the recessed portion has a small inclined portion in which an angle to the surface of the GaN semiconductor substrate is equal to or greater than 80° and equal to or less than 90° at a position serving as a lower portion of the gate electrode; and
    the removing of the surface layer portion of the body layer includes polishing the surface of the GaN semiconductor substrate and stopping the polishing in a state where the small inclined portion is positioned on the surface of the GaN semiconductor substrate.

3. The method according to claim 1, wherein the forming of the recessed portion includes forming the recessed portion such that the side surface of the recessed portion has a large inclined portion, which is inclined such that a depth of the recessed portion increases as a distance from an end of the recessed portion increases and in which an angle to the surface of the GaN semiconductor substrate is less than 60°, at a position serving as a lower portion of the gate electrode.

4. The method according to claim 1, further comprising:
    forming a stopper layer on the surface of the GaN semiconductor substrate before the body layer is grown, wherein:
    the growing of the body layer includes growing the body layer such that the stopper layer is covered; and
    the removing the surface layer portion of the body layer includes polishing the body layer until the stopper layer is exposed by using a polishing method in which polishing efficiency of the stopper layer is lower than polishing efficiency of the body layer, and polishing the body layer and the stopper layer until the stopper layer is removed.

5. The method according to claim 1, wherein the forming of the recessed portion includes forming the recessed portion in the surface of the GaN semiconductor substrate through etching.

6. The method according to claim 1, wherein the growing of the body layer includes growing the body layer through epitaxial growth.

* * * * *